United States Patent
La Rosa et al.

(10) Patent No.: US 8,872,177 B2
(45) Date of Patent: Oct. 28, 2014

(54) ELECTRIC CHARGE FLOW CIRCUIT FOR A TIME MEASUREMENT

(75) Inventors: Francesco La Rosa, Rousset (FR); Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 25 days.

(21) Appl. No.: 13/615,309

(22) Filed: Sep. 13, 2012

(65) Prior Publication Data

US 2013/0088263 A1 Apr. 11, 2013

(30) Foreign Application Priority Data

Oct. 6, 2011 (FR) ...................................... 11 59025

(51) Int. Cl.

| | | |
|---|---|---|
| H01L 23/58 | (2006.01) | |
| H01L 29/94 | (2006.01) | |
| H01L 49/02 | (2006.01) | |
| H01L 21/84 | (2006.01) | |
| H01L 23/522 | (2006.01) | |
| G04F 13/00 | (2006.01) | |
| G11C 27/02 | (2006.01) | |
| H01L 27/08 | (2006.01) | |
| H01L 27/12 | (2006.01) | |

(52) U.S. Cl.
CPC .............. G11C 27/024 (2013.01); H01L 29/94 (2013.01); H01L 28/40 (2013.01); H01L 21/84 (2013.01); H01L 23/5223 (2013.01); G04F 13/00 (2013.01); H01L 27/0805 (2013.01); H01L 27/1203 (2013.01)
USPC .......................................... 257/48

(58) Field of Classification Search
USPC .......................................... 257/48, 314–324
See application file for complete search history.

(56) References Cited

U.S. PATENT DOCUMENTS

| | | | |
|---|---|---|---|
| 4,266,144 A | 5/1981 | Bristol | |
| 2007/0147141 A1* | 6/2007 | Shibata | ..................... 365/189.09 |
| 2008/0232183 A1* | 9/2008 | Maejima et al. | .............. 365/205 |
| 2010/0020648 A1 | 1/2010 | La Rosa | |

OTHER PUBLICATIONS

French Search Report and Written Opinion dated Mar. 20, 2012 from corresponding French Application No. 11/59025.

* cited by examiner

*Primary Examiner* — Cuong Q Nguyen
(74) *Attorney, Agent, or Firm* — Gardere Wynne Sewell LLP

(57) ABSTRACT

A charge flow circuit for a time measurement, including a plurality of elementary capacitive elements electrically in series, each elementary capacitive element leaking through its dielectric space.

20 Claims, 2 Drawing Sheets

ELECTRIC CHARGE FLOW CIRCUIT FOR A TIME MEASUREMENT

CROSS REFERENCE TO RELATED APPLICATIONS

This application claims the priority benefit of French patent application number 11/59025, filed on Oct. 6, 2011, which is hereby incorporated by reference to the maximum extent allowable by law.

BACKGROUND

1. Technical Field

The present disclosure generally relates to electronic circuits, and more specifically the forming of a circuit enabling to controllably retain electric charges for a time measurement.

2. Discussion of the Related Art

In many applications, it is desired to have information representative of a time elapsed between two events, be it an accurate or approximate measurement. An example of application relates to the time management of rights of access, especially to media.

The obtaining of this information representative of the elapsed time conventionally requires a time measurement by an electronic circuit powered, for example, by means of a battery, to avoid losing track of the information when the circuit is off.

It would be desirable to have a time measurement which operates even if the electronic measurement circuit is not powered.

An electronic device in which the time elapsed between two events is determined by measuring the charge of a capacitive storage element having an electrode connected to an electrode of a capacitive charge flow element leaking into its dielectric space has already been provided, for example, in patent application WO2008012459. The storage element is charged when the device is powered, and its residual charge, after an interruption of the power supply, is measured when the device is supplied again. This residual charge is considered as representative of the time elapsed between the two device supply times.

The charge flow element comprises a region of smaller thickness in its dielectric space, capable of letting charges leak by tunnel effect. The storage element discharge speed is linked to the dimensions of the flow element leakage region. In particular, the storage element discharge speed increases as the thickness of the leakage region decreases and/or as the surface (seen from the top) of the leakage region increases.

A disadvantage is that, in practice, the sizing of the leakage region depends significantly on the considered technological manufacturing process. Indeed, the charge retention circuit is generally integrated on a chip comprising other components, for example, memories, logic blocks, etc. To avoid increasing the chip manufacturing cost, it is attempted to form the charge retention circuit with no additional manufacturing step with respect to the steps of manufacturing of the other components. In some recent technological processes, the dielectric layers available to form the leakage region of the flow element are too thin to enable the storage element to discharge slowly, even if the surface area of the leakage region is decreased to a minimum. As a result, the time measurement can only be possible, in the absence of a power supply, for a very short time, poorly adapted to most applications.

SUMMARY

Thus, an embodiment provides an electric charge flow element for a time measurement, overcoming all or part of the disadvantages of known charge flow elements.

Another embodiment provides a charge flow element of small leakage speed, which can be formed whatever the considered technological manufacturing process.

Another embodiment provides an electric charge retention circuit controllable for a time measurement.

Thus, an embodiment provides a charge flow circuit for a time measurement, comprising a plurality of elementary capacitive elements electrically in series, each elementary capacitive element leaking through its dielectric space.

According to an embodiment, each elementary capacitive element comprises a stack of a first electrode, of a dielectric layer, and of a second electrode, said dielectric layer comprising at least one region of smaller thickness capable of letting charges flow by tunnel effect.

According to an embodiment, the first electrodes are formed in a same first conductive or semiconductor level of an integrated circuit chip, and the second electrodes are formed in a same second conductive level of the chip.

According to an embodiment, the dielectric layer comprises an oxide-nitride-oxide stack, the region of smaller thickness being made of silicon oxide.

According to an embodiment, the first and second electrodes are made of polysilicon.

According to an embodiment, the first electrodes are regions of a semiconductor substrate, and the second electrodes are made of polysilicon.

According to an embodiment, each elementary capacitive element has a capacitance ranging between $1*10^{-15}$ and $5*10^{-15}$ farads.

Another embodiment provides an electric charge retention circuit for a time measurement, comprising a capacitive charge storage element connected to a charge flow circuit of the above-mentioned type.

According to an embodiment, the capacitive storage element has a capacitance ranging between $10*10^{-12}$ and $100*10^{-12}$ farads.

According to an embodiment, the charge retention circuit further comprises a capacitive initialization element connected to a floating node common to the storage element and to the flow circuit.

According to an embodiment, the capacitive initialization element has a capacitance ranging between $10*10^{-15}$ and $100*10^{-15}$ farads.

According to an embodiment, the charge retention circuit further comprises a device for measuring the residual charge of the storage element, said device comprising, connected to each node common to two successive capacitive elements of the charge flow circuit, a comparator capable of comparing the voltage of the node with a threshold.

Another embodiment provides an integrated circuit chip formed inside and on top of a semiconductor substrate, comprising non-volatile memory cells, logic blocks comprising MOS transistors, and an electric charge retention circuit for a time measurement of the above type.

The foregoing and other features and advantages will be discussed in detail in the following non-limiting description of specific embodiments in connection with the accompanying drawings.

DETAILED DESCRIPTION

Figure 1:
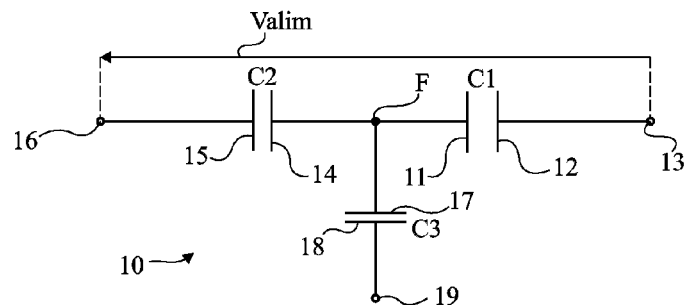
FIG. 1 is an electric diagram of an example of a circuit capable of controllably retaining electric charges for a time measurement.

For clarity, the same elements have been designated with the same reference numerals in the different drawings and, further, as usual in the representation of integrated circuits, the various drawings are not to scale. Further, only those elements which are useful to the understanding of the embodiments have been shown and will be described. In particular, the destination of the time measurements generated by the described circuits has not been detailed, the described embodiments being compatible with usual applications of such time measurements.

FIG. 1 is an electric diagram of an example of a circuit 10 capable of controllably retaining electric charges for a time measurement. Circuit 10 comprises a first capacitive element C1 having a first electrode 11 connected to a floating node F and having a second electrode 12 connected to a terminal 13 of application of a voltage, and a second capacitive element C2 having a first electrode 14 connected to node F and having a second electrode 15 connected to a terminal 16 of application of a voltage. Circuit 10 further comprises a third capacitive element C3 having a first electrode 17 connected to node F and having a second electrode 18 connected to a terminal 19 of application of a voltage, and having its dielectric space designed, by its permittivity and/or by its thickness, to have non-negligible leakages along time. Capacitive element C1 has a charge retention capacitance greater than that of element C3, and capacitive element C2 has a charge retention capacitance greater than that of element C3, but smaller than that of element C1.

A function of capacitive element C1 (storage element) is to store electric charges. A function of capacitive element C3 (flow element) is to discharge storage element C1, relatively slowly with respect to a direct connection of its electrode 11 to ground. A function of capacitive element C2 is to allow a charge injection into capacitive element C1, while avoiding the resulting stress, for flow element C3, of a direct charge of storage element C1 by application of a power supply voltage between node F and terminal 13.

In an initialization step of a charge retention phase, terminals 13 and 19 are at a reference voltage, for example, the ground, and a high power supply voltage (positive with respect to ground) Valim is applied to terminal 16, which causes the charge of capacitive element C1. As a variation, in order to charge element C1, terminal 19 may be grounded, and terminals 16 and 13 may be set to respectively positive and negative voltages with respect to ground.

When the power supply voltage is no longer applied between terminals 16 and 13, for example, when the circuit is no longer powered, storage element C1 discharges in controlled manner (relatively slowly) through flow element C3. It should be noted that a controlled discharge phase may also be provided while the circuit is still powered. In the discharge phase, terminals 13, 16, and 19 may be left floating, or set to a same reference voltage, for example, the ground.

In a read step, after a discharge phase, the residual charge of storage element C1 is measured (for the measurement, the device must be powered). The residual charge of element C1 is considered as representative of the time elapsed between the end of the initialization step and the read step.

A reset step may be provided to fully discharge storage element C1 through capacitive element C2. To achieve this, terminals 19 and 16 may be grounded, and terminal 13 may be set to a high power supply voltage (for example, Valim). As a variation, terminal 19 may be grounded, and terminals 13 and 16 may be set to respectively positive and negative voltages with respect to ground.

An accelerated controlled phase of discharge of storage element C1 (through flow element C3) may also be provided, for example, for time measurement circuit testing purposes. To achieve this, terminal 19 may be grounded, and terminals 13 and 16 may be biased to a same positive voltage with respect to ground, for example, a voltage ranging between the ground voltage and voltage Valim.

Examples of implementation and of operation of an electric charge retention circuit for a time measurement, of the type described in relation with FIG. 1, are further detailed in above-mentioned patent application WO200812459. This document especially describes an example of a circuit capable of measuring the residual charge of storage element C1 and of deducing information relative to the time elapsed between the end of the initialization step of a charge retention phase and the read step.

The forming of capacitive element C3 of controlled electric charge flow is here more specifically considered.

FIGS. 2A to 2D are cross-section views showing steps of a method for manufacturing an example of a capacitive electric charge flow element C3 for a time measurement. In this example, element C3 is formed in a technological process of manufacturing of semiconductor chips comprising both non-volatile memories and logic blocks based on MOS transistors (not shown in the drawings). The chips are formed from a substrate 21, for example, made of silicon. The non-volatile memories are at least partially formed on an insulating layer 23, for example, made of silicon oxide. Layer 23 for example comprises insulating wells formed in the upper portion of the substrate according to an insulating region forming technique currently called STI, for Shallow Trench Insulation. Any other method for forming an insulating layer 23 of adapted thickness may however be used. Each memory cell comprises, superposed in the following order from the upper surface of layer 23, a lower electrode formed in a first polysilicon level P1, an oxide-nitride-oxide stack (for example, silicon oxide—silicon nitride—silicon oxide) corresponding to a first ONO dielectric level, and an upper electrode formed in a second polysilicon level P2. The MOS transistors comprises, superposed in the following order above a properly-doped substrate region, a silicon oxide layer (gate insulator) formed in a second dielectric level GO1 of smaller thickness than the ONO level, and a polysilicon gate formed in level P2.

It is desired to form charge flow element C3 with no additional steps with respect to the memory cell and MOS transistor manufacturing steps, that is, only using the above-mentioned conductive and insulating levels.

Figure 2A:
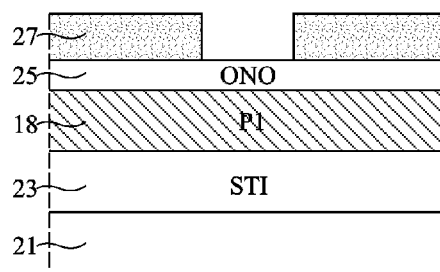
FIGS. 2A to 2D are cross-section views showing steps of a method for manufacturing an example of an electric charge flow element for a time measurement.

In steps of manufacturing of flow element C3, illustrated in FIG. 2A, an insulating silicon oxide well 23 (STI) is formed in the upper portion of substrate 21, and a first electrode 18 is formed at the surface of well 23, in polysilicon level P1. Electrode 18 is coated with a dielectric layer 25, formed in the ONO level. A resin mask 27 is formed at the surface of dielectric layer 25, delimiting a window coinciding, as seen from above, with the leakage region of flow element C3. It should be noted that layer 23 is not necessarily an STI-type well but may be formed by any adapted method for forming an insulating layer. It will however be ascertained that the dielectric thickness (or equivalent thickness) between the substrate and electrode 18 is at least equal to the thickness of the dielectric of capacitive element C2.

Figure 2B:
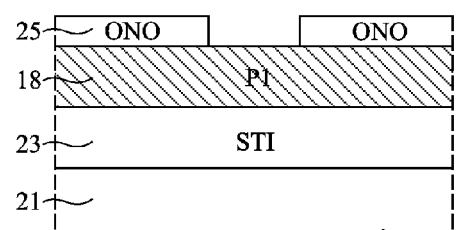

FIG. 2B illustrates a step during which the unmasked region of dielectric layer 25 is removed by etching, the etching stopping on polysilicon P1 of electrode 18. Resin mask 27 is then removed.

Figure 2C:
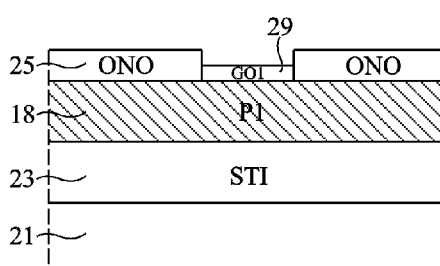

FIG. 2C illustrates a step of forming of a dielectric layer 29, formed in level GO1, at the location where the portion of layer 25 has been removed at the previous step. As an example, level GO1 may be formed by oxide growth, for example, according to a rapid thermal processing method currently called RTP.

Figure 2D:
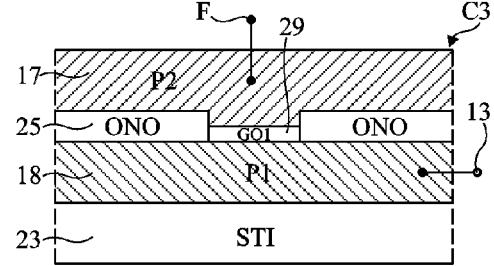

FIG. 2D illustrates the forming of an upper electrode 17 of flow element C3 in polysilicon level P2.

Layer 29, defining the leakage region of element C3, should be adapted, by its thickness and/or by its dielectric permittivity, to letting electric charges flow between electrodes 17 and 18 by tunnel effect. The charge flow speed should be non-negligible, but sufficiently slow to enable a low discharge of storage element C1 (FIG. 3) and thereby a time measurement, in the absence of a power supply, for a significant time period, for example, several hours or days.

In some recent technological processes, the thickness of oxide GO1 is on the order of 2 nm, which is not sufficient to enable storage element C1 to slowly discharge, even if the surface area (in top view) of leakage region 29 is decreased. As an example, for a 2-nm oxide thickness GO1, the discharge time of storage element C1 is on the order of one second while it is of several hours for a 3-nm thickness of oxide GO1.

To overcome this disadvantage, a charge flow element for a time measurement, comprising a plurality of series-connected capacitive elements, with each capacitive element leaking through its dielectric space, is provided.

Figure 3:
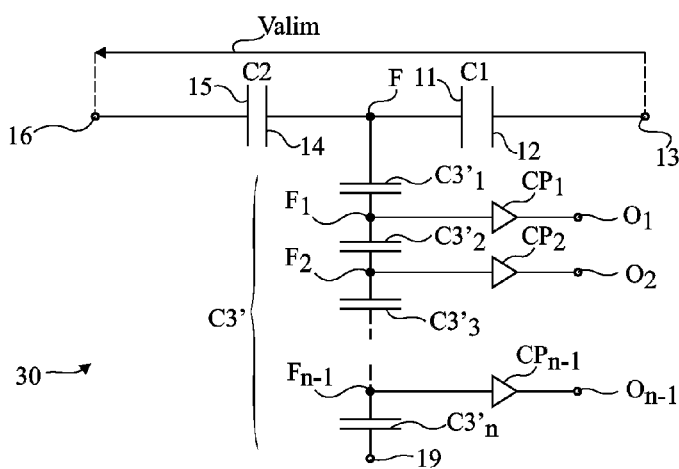
FIG. 3 is an electric diagram of an embodiment of a circuit capable of controllably retaining electric charges for a time measurement.

FIG. 3 is an electric diagram of an embodiment of a circuit 30 capable of controllably retaining electric charges for a time measurement. Circuit 30 differs from circuit 10 of FIG. 1 in that flow element C3 of circuit 10 has been replaced with a flow element C3' comprising a plurality of series-connected capacitive elements $C3_i'$ (with i ranging from 1 to n, and n being an integer greater than 1), each capacitive element $C3_i'$ leaking into its dielectric space.

The present inventors have observed that when capacitive charge flow elements of the type described in relation with FIGS. 1 and 2A to 2D are arranged in series, the resistance seen by the electric charges, during the leakage by tunnel effect, increases proportionally to the number of capacitive elements, thus causing an exponential decrease in the discharge speed of storage element C1.

Functionally, charge retention circuit 30 of FIG. 3 may be used in the same way as circuit 10 of FIG. 1, that is, by applying adapted voltages on terminals 13, 16, and 19, steps of initialization of a charge retention phase, phases of controlled discharge of storage element C1, steps of reading of the residual charge of element C1, reset steps, and steps of accelerated controlled discharge of element C1 may be provided.

In the example of FIG. 3, a plurality of comparators $CP_j$, with j ranging from 1 to n−1, are connected to intermediate nodes $F_j$ of flow element C3'. In a read phase, each comparator $CP_j$ receives as an input the voltage of node $F_j$ common to capacitive elements $C3_j'$ and $C3_{j+1}'$, and compares this voltage with a threshold. In an embodiment, the same comparison threshold is set for all comparators, for example, smaller than the voltage taken by node $F_{n-1}$ when storage node C1 is charged. Each comparator $CP_j$ provides binary information on an output terminal $O_j$. When storage element C1 discharges, the switches will switch one after the other, starting with comparator $CP_{n-1}$. The binary word formed by all the binary information available on terminals $O_j$ (n−1 bits) provides data relative to the charge state of storage element C1, and thus to the time elapsed from the beginning of the phase of discharge of element C1. This measurement circuit has the advantage of having a simple design with respect to a circuit for measuring the residual charge directly connected across element C1. It will however be within the abilities of those skilled in the art to provide any other circuit capable of measuring the residual charge of capacitor C1 and of deducing data relative to an elapsed time.

For a proper operation of circuit 30, node F and intermediate nodes $F_j$ are preferably floating, that is, separated, by a dielectric space, from any terminal of application of a voltage, and not directly connected to a non-insulated region of the semiconductor chip substrate (in which case the leakage into the substrate may be preponderating over the leakage through flow element C3').

As an example of embodiment, the capacitance of storage element C1 ranges between $10*10^{-12}$ and $100*10^{-12}$ farads (from 10 to 100 picofarads), for example, being on the order of $50*10^{-12}$ farads, the capacitance of initialization element C2 ranges between $10*10^{-15}$ and $100*10^{-15}$ farads (from 10 to 100 femtofarads), for example, being on the order of $50*10^{-15}$ farads, and the capacitance of each elementary capacitive element $C3_i'$ ranges between $1*10^{-15}$ and $5*10^{-15}$ farads (from 1 to 5 femtofarads), for example, being on the order of $2*10^{-15}$ farads.

In all cases, due to the used dielectric thicknesses, all capacitive elements C1 and C2 have a negligible parasitic leakage (through their dielectric spaces) with respect to that of flow element C3'. As an example, the capacitance of element C2 is formed by using as a dielectric an oxide currently used to form a non-volatile memory cell capable of retaining data for a time period of at least 20 years, while the duration of the charge flow through element C3' may be on the order of a few days. What is more, the thickness of the dielectric of element C1 being greater than the thickness of the dielectric of element C2, the parasitic leakage through element C1 is absolutely negligible as compared with the leakage through flow element C3'.

Figure 4:
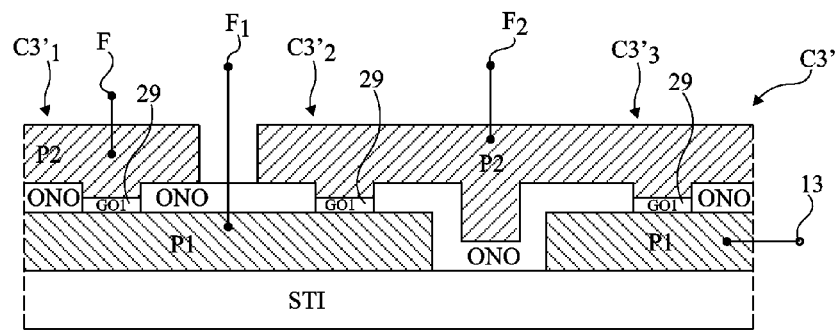
FIG. 4 is a cross-section view showing an embodiment of an electric charge flow element for a time measurement.

FIG. 4 is a cross-section view showing an embodiment of an electric charge flow element C3' for a time measurement. In the example of FIG. 4, element C3' comprises three series-connected capacitive elements $C3_1'$, $C3_2'$, and $C3_3'$, each capacitive element $C3_i'$ leaking into its dielectric space. Each element $C3_i'$ is an element of the type described in relation with FIG. 2D, formed in conductive levels P1 and P2 and in dielectric levels ONO and GO1 of an integrated circuit chip. Elements $C3_i'$ are placed side-by-side and are alternately connected two-by-two by their lower electrodes (level P1) and by their upper electrodes (level P2). In this example, the lower electrodes (level P1) of elements $C3_1'$ and $C3_2'$ are one and the same, and the upper electrodes (level P2) of elements $C3_2'$ and $C3_3'$ are one and the same. The upper electrode (level P1) of element $C3_1'$ is intended to be connected to node F (FIG. 3) and the lower electrode (level P2) of element $C3_3'$ is intended to be connected to terminal 13.

Figure 5:
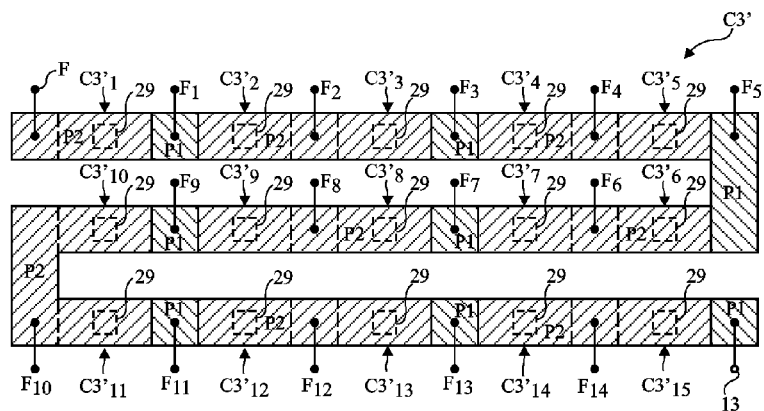
FIG. 5 is a top view showing an alternative embodiment of the electric charge flow element of FIG. 4.

FIG. 5 is a top view showing an alternative embodiment of electric charge flow element C3' of FIG. 4. In this variation, element C3' comprises fifteen series-connected capacitive elements C3$_i$', each capacitive element C3$_i$' leaking into its dielectric space. As illustrated in FIG. 5, elements C3$_i$' are placed side-by-side and arranged in a serpentine shape in top view. This configuration enables to reduce the surface area taken up by the charge flow element.

In an embodiment, the thickness of the dielectric of storage element C1 (FIG. 3) ranges between 15 and 20 nm, the dielectric thickness of capacitive initialization element C2 (FIG. 3) ranges between 7 and 10 nm, the thickness of dielectric level GO1 is on the order of 2 nm, and the surface area, in top view, of leakage regions 29, is a square or rectangular surface of approximately from 0.3 to 0.4 μm by 0.4 to 0.5 μm, for example, of 0.38 μm by 0.46 μm.

An advantage of the embodiments described in relation with FIGS. 4 and 5 is that they require no additional manufacturing step with respect to the integrated circuit chip manufacturing steps comprising both non-volatile memories and logic blocks based on MOS transistors.

Figure 6:
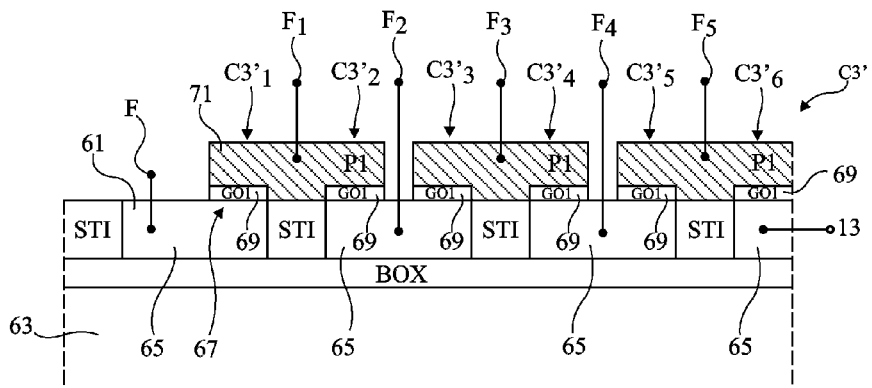
FIG. 6 is a cross-section view showing another embodiment of an electric charge flow element for a time measurement.

FIG. 6 is a cross-section view showing another embodiment of an electric charge flow element C3' for a time measurement. In this example, element C3' comprises six series-connected capacitive elements C3$_i$', each element C3$_i$' leaking into its dielectric space. Element C3' is formed in a technological semiconductor chip manufacturing process comprising logic blocks based on MOS transistors (not shown in the drawing), such chips being formed from a substrate 61 of semiconductor-on-insulator type. Substrate 61, for example, made of silicon, is an epitaxial layer having a thickness of a few μm formed at the surface of an insulating layer BOX, for example, made of silicon oxide, layer BOX being itself formed at the surface of a support 63, for example, made of silicon. Insulating regions STI, for example, made of silicon oxide, extend vertically from the surface of substrate 61 to insulating layer BOX, delimiting substrate regions 65 fully insulated from one another. MOS transistors are formed inside and on top of regions 65. Each transistor MOS comprises, above a properly-doped substrate region, a stack of a silicon oxide layer (gate insulator) formed in a dielectric level GO1, and of a gate formed in a polysilicon level P1.

It is desired to form charge flow element C3' with no additional steps with respect to the MOS transistor manufacturing steps, that is, only using the above-mentioned conductive and insulating levels.

Each capacitive element C3$_i$' comprises a stack of a lower electrode 67, formed by a region 65 of semiconductor substrate 61, of a dielectric layer 69, made in level GO1, and of an upper electrode 71 formed in polysilicon level P1. Layer 69, by its thickness and its permittivity, has a non-negligible leakage along time. Elements C3$_i$' are placed side-by-side and are alternately connected two-by-two by their upper electrodes and by their lower electrodes. In practice, inside and on top of each substrate region 65, at most two elements C3$_i$' are formed. Elements C3$_i$' of a same region 65 are connected by their lower electrodes (formed by substrate 61 itself), and elements C3$_i$' of neighboring wells are connected by their upper electrodes (of polysilicon of level P1).

This embodiment has the advantage of requiring no additional manufacturing step with respect to the steps of manufacturing of an integrated circuit chip formed inside and on top of a substrate of semiconductor-on-insulator type, and comprising logic blocks formed based on MOS transistors.

More generally, it will be within the abilities of those skilled in the art to form in any adapted technology, by providing or not specific manufacturing steps, a charge flow element for a time measurement, comprising a plurality of capacitive elements in series, each capacitive element leaking into its dielectric space.

An advantage of such a charge flow element is that the charge leakage rate may be relatively slow, whatever the technological manufacturing process used to form the element. In particular, the provided charge flow element enables to perform a time measurement, in the absence of any power supply, for a period of several hours or several days, by using a silicon oxide layer having a thickness smaller than 3 nm to form the leakage region of the element.

Specific embodiments have been described. Various alterations, modifications, and improvements will occur to those skilled in the art. In particular, it will be within the abilities of those skilled in the art to use a charge flow element of the type provided in any circuit capable of retaining electric charges for a time measurement, other than that described in relation with FIG. 3.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A charge flow circuit for a time measurement, comprising a plurality of elementary capacitive elements electrically in series, each elementary capacitive element leaking through its dielectric space, wherein each elementary capacitive element comprises a stack of a first electrode, of a dielectric layer, and of a second electrode, said dielectric layer comprising at least one region capable of letting charges flow by tunnel effect.

2. The charge flow circuit of claim 1, wherein said at least one region capable of letting charges flow by tunnel effect is of smaller thickness.

3. The charge flow circuit of claim 1, wherein said first electrodes are formed in a same first conductive or semiconductor level of an integrated circuit chip, and wherein said second electrodes are formed in a same second conductive level of the chip.

4. The charge flow circuit of claim 2, wherein said dielectric layer comprises an oxide-nitride-oxide stack, said at least one region of smaller thickness being made of silicon oxide.

5. The charge flow circuit of claim 1, wherein said first and second electrodes are made of polysilicon.

6. The charge flow circuit of claim 1, wherein said first electrodes are regions of a semiconductor substrate, and said second electrodes are made of polysilicon.

7. The charge flow circuit of claim 1, wherein each elementary capacitive element has a capacitance ranging between $1*10^{-15}$ and $5*10^{-15}$ farads.

8. An electric charge retention circuit for a time measurement, comprising a capacitive charge storage element connected to the charge flow circuit of claim 1.

9. The circuit of claim 8, wherein the capacitive storage element has a capacitance ranging between $10*10^{-12}$ and $100*10^{-12}$ farads.

10. The circuit of claim 8, further comprising a capacitive initialization element connected to a floating node common to the capacitive charge storage element and to the flow circuit.

11. The circuit of claim 10, wherein the capacitive initialization element has a capacitance ranging between $10*10^{-15}$ and $100*10^{-15}$ farads.

12. The circuit of claim 8, further comprising a device for measuring a residual charge of the capacitive charge storage element, said device comprising, connected to each node common to two successive capacitive elements of the charge flow circuit, a comparator capable of comparing the voltage of said node with a threshold.

13. An integrated circuit chip formed inside and on top of a semiconductor substrate, comprising non-volatile memory cells, logic blocks comprising MOS transistors, and the electric charge retention circuit for a time measurement of claim 8.

14. A charge retention circuit comprising:
 a capacitive charge storage element having an electrode connected to a floating node; and
 a charge flow circuit connected to the floating node, the charge flow circuit comprising a plurality of series-connected elementary capacitive elements, wherein the charge storage element has a larger charge retention capacitance than the charge flow circuit, wherein each elementary capacitive element comprises a stack of a first electrode, of a dielectric layer, and of a second electrode, said dielectric layer comprising at least one region capable of letting charges flow by tunnel effect.

15. A charge retention circuit as defined in claim 14, wherein said dielectric layer includes a first region and a second region, and wherein the first region operates by tunnel effect.

16. A charge retention circuit as defined in claim 15, wherein the first region of the dielectric layer has a smaller thickness than the second region.

17. A charge retention circuit as defined in claim 14, further comprising a capacitive initialization element connected to the floating node.

18. A charge retention circuit as defined in claim 17, wherein the capacitive initialization element has a charge retention capacitance greater than the charge flow circuit but smaller than the capacitive charge storage element.

19. A charge retention circuit as defined in claim 14, further comprising a comparator connected to each node connected to two successive series-connected capacitive elements of the charge flow circuit, wherein each comparator is configured to compare the voltage of the respective node with a threshold value.

20. A charge retention circuit as defined in claim 14, wherein the first and second electrodes are formed in conductive levels of an integrated circuit and the dielectric layer is formed in a dielectric level of the integrated circuit.

* * * * *